United States Patent
Park et al.

(10) Patent No.: US 7,317,219 B2
(45) Date of Patent: Jan. 8, 2008

(54) MAGNETIC RANDOM ACCESS MEMORY (MRAM) AND METHOD OF MANUFACTURING THE SAME

(75) Inventors: Sang-jin Park, Pyeongtaek-si (KR); Tae-wan Kim, Yongin-si (KR); Wan-jun Park, Seoul (KR); Jang-eun Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/971,704

(22) Filed: Oct. 25, 2004

(65) Prior Publication Data

US 2005/0146967 A1 Jul. 7, 2005

(30) Foreign Application Priority Data

Oct. 24, 2003 (KR) ............. 10-2003-0074663

(51) Int. Cl.
*H01L 29/76* (2006.01)
*H01L 29/94* (2006.01)
*H01L 31/00* (2006.01)
*G11C 11/00* (2006.01)

(52) U.S. Cl. ....................... 257/295; 365/158
(58) Field of Classification Search ............... None
See application file for complete search history.

(56) References Cited

U.S. PATENT DOCUMENTS

| | | | | |
|---|---|---|---|---|
| 5,930,164 | A | * | 7/1999 | Zhu ........................ 365/158 |
| 6,205,052 | B1 | * | 3/2001 | Slaughter et al. ........... 365/173 |
| 6,937,446 | B2 | * | 8/2005 | Kamiguchi et al. ......... 360/324.1 |
| 2002/0051380 | A1 | * | 5/2002 | Kamiguchi et al. ......... 365/158 |
| 2004/0085681 | A1 | * | 5/2004 | Kai et al. .................. 360/313 |
| 2004/0165425 | A1 | * | 8/2004 | Nakamura et al. .......... 365/171 |
| 2005/0068834 | A1 | * | 3/2005 | Kim et al. .................. 365/222 |

\* cited by examiner

*Primary Examiner*—Andy Huynh
*Assistant Examiner*—Hoang-Quan Ho
(74) *Attorney, Agent, or Firm*—Lee & Morse, P.C.

(57) ABSTRACT

A magnetic random access memory (MRAM), and a method of manufacturing the same, includes a switching device and a magnetic tunneling junction (MTJ) cell connected to the switching device, wherein the MTJ cell includes a pinned film having a metal film and a magnetic film, the magnetic film enclosing the metal film.

15 Claims, 6 Drawing Sheets

MAGNETIC RANDOM ACCESS MEMORY (MRAM) AND METHOD OF MANUFACTURING THE SAME

BACKGROUND OF THE INVENTION

1. Field of the Invention

The present invention relates to a semiconductor memory device and a method of manufacturing the same. More particularly, the present invention relates to a magnetic random access memory (MRAM) including a magnetic tunneling junction (MTJ) cell and a method of manufacturing the same.

2. Description of the Related Art

A magnetic random access memory (MRAM) is a memory device that writes and reads data using a phenomenon in which a resistance of a magnetic tunneling junction (MTJ) cell varies according to a magnetization direction of upper and lower magnetic films, which are separated by an insulating film in the MTJ cell.

FIG. 1 illustrates a cross-sectional view of a conventional MTJ cell included in a conventional MRAM.

Referring to FIG. 1, the conventional MTJ cell M1 of the conventional MRAM includes an amorphous buffering film 12 and a pinning film 14, which is a semi-ferromagnetic film, that are sequentially formed on a lower electrode 10. A pinned film 16 is formed on the pinning film 14. The pinned film 16 includes a first ferromagnetic film 16a, a metal film 16b, and a second ferromagnetic film 16c, which are sequentially formed on the entire surface of the pinning film 14. Arrows in FIG. 1 indicate directions of magnetic fields in the first and second ferromagnetic films 16a and 16c. It can be seen that a direction of a magnetic field in the first ferromagnetic film 16a is opposite to a direction of a magnetic field in the second ferromagnetic film 16c.

Generally, a film including a metal film having magnetic films disposed on and under the metal film, e.g., the pinned film 16, is called a synthetic anti-ferromagnetic (SAF) film. In an SAF film, spin directions of upper and lower magnetic films are fixed in an antiparallel state due to a thickness of the metal film. In the SAF film, an exchange bias between the upper and lower magnetic films exceeds 1000 Oe. Thus, the thermal stability of the SAF film is superior to that of a single magnetic film. Accordingly, the SAF film has widely been used as a pinned film of an MTJ cell.

Referring again to FIG. 1, a tunneling film 22 is formed on the second ferromagnetic film 16c of the pinned film 16. A free magnetic film 24 and a capping film 26 are then sequentially formed on the tunneling film 22. The direction of the magnetic field of the free magnetic film 24 is determined by an external magnetic field. The capping film 26 protects the free magnetic film 24.

The MTJ cell generates a stray magnetic field, which is caused by the first ferromagnetic film 16a and/or the second ferromagnetic film 16c. This stray magnetic field affects the free magnetic film 24 by causing a kink when the free magnetic film 24 is switched.

More specifically, the stray magnetic field affects a portion, in particular, an outer portion, of the free magnetic film 24 while the free magnetic film 24 is being switched. As a result, the affected portion of the free magnetic film 24 operates abnormally in that it is later in switching than other portions thereof or enters a substantially different magnetization state.

The effect of the stray magnetic field depends on the thicknesses of the elements constituting the MTJ cell M1. As an example, FIGS. 2 through are graphs showing the influence of a stray magnetic field on the switching characteristic of the free magnetic film 24 depending on thicknesses of the elements of the MTJ cell M1.

FIG. 2 shows the switching characteristic of the free magnetic film 24 when the first ferromagnetic film 16a, which is a lower magnetic film of the pinned film 16, is thicker than the second ferromagnetic film 16c, which is an upper magnetic film (hereinafter, the first case).

In FIG. 2, reference characters C1 and C2 denote a first magnetization state indicating unit and a second magnetization state indicating unit (hereinafter, first and second indicating units), which indicate the magnetization states of the free magnetic film 24 and the first and second ferromagnetic films 16a and 16c in the first case. In the first and second indicating units C1 and C2, two lowermost arrows indicate the magnetization state of the first ferromagnetic film 16a, an intermediate arrow indicates the magnetization state of the second ferromagnetic film 16b, and an uppermost arrow indicates the magnetization state of the free magnetic film 24.

Referring to FIG. 2, in the first case, there exists a region P1 in which the free magnetic film 24 is abnormally switched in a switching characteristic curve of the free magnetic film 24. Thus, a switching magnetic field is shifted.

FIG. 3 shows a switching characteristic of the free magnetic film 24 when the second ferromagnetic film 16c is thicker than the first ferromagnetic film 16a (hereinafter, the second case).

In FIG. 3, reference characters C3 and C4 denote a third magnetization state indicating unit and a fourth magnetization state indicating unit (hereinafter, third and fourth indicating units), which indicate the magnetization states of the free magnetic film 24 and the first and second magnetization state indicating units 16a and 16c in the second case. In the third and fourth indicating units C3 and C4, a lowermost arrow indicates the magnetization state of the first ferromagnetic film 16a, two intermediate arrows indicate the magnetization state of the second ferromagnetic film 16c, and an uppermost arrow indicates the magnetization state of the free magnetic film 24.

Referring to FIG. 3, in the second case, there exists a region P4 in which the free magnetic film 24 is abnormally switched in a lower right portion of a switching characteristic curve of the free magnetic film 24. Thus, a switching magnetic field is shifted.

FIG. 4 shows a switching characteristic of the free magnetic film 24 when the first ferromagnetic film 16a is as thick as the second ferromagnetic film 16c and both are relatively thick (hereinafter, the third case).

In FIG. 4, reference characters C5 and C6 denote a fifth magnetization state indicating unit and a sixth magnetization state indicating unit (hereinafter, fifth and sixth indicating units), which indicate the magnetization states of the free magnetic film 24 and the first and second ferromagnetic films 16a and 16c in the third case. In the fifth and sixth indicating units C5 and C6, two lowermost arrows indicate the magnetization state of the first ferromagnetic film 16a, two intermediate arrows indicate the magnetization state of the second ferromagnetic film 16c, and an uppermost arrow indicates the magnetization state of the free magnetic film 24.

Referring to FIG. 4, in the third case, there exist regions P2 and P3 in which the free magnetic film 24 is abnormally switched in left and right portions of a switching characteristic curve of the free magnetic film 24.

Thus, a switching magnetic field is shifted.

FIG. 5 shows a switching characteristic of the free magnetic film 24 when the first ferromagnetic film 16a is as thick as the second ferromagnetic film 16c and both are relatively thin (hereinafter, the fourth case).

In FIG. 5, reference characters C7 and C8 denote a seventh magnetization state indicating unit and an eighth magnetization state indicating unit (hereinafter, seventh and eighth indicating units), which indicate the magnetization states of the free magnetic film 24 and the first and second ferromagnetic films 16a and 16c. In the seventh and eighth indicating units C7 and C8, a lowermost arrow indicates the magnetization state of the first ferromagnetic film 16a, an intermediate arrow indicates the magnetization sate of the second ferromagnetic film 16c, and an uppermost arrow indicates the magnetization state of the free magnetic film 24.

Referring to FIG. 5, in the fourth case, although there is no region in which the free magnetic film 24 is abnormally switched in a switching characteristic curve of the free magnetic film 24 as opposed to the first through third cases. However, a switching magnetic field is still shifted.

SUMMARY OF THE INVENTION

The present invention is therefore directed to a magnetic random access memory (MRAM) and a method of manufacturing the same, which substantially overcome one or more of the problems due to the limitations and disadvantages of the related art.

It is a feature of an embodiment of the present invention to provide an MRAM, and a method of manufacturing the same, that prevents shifting of a switching magnetic field, thereby improving the reliability of the MRAM.

It is another feature of an embodiment of the present invention to provide an MRAM, and a method of manufacturing the same, that avoids a kink, i.e., a region in which a free magnetic film is abnormally switched, which is caused by a stray magnetic field, in a switching characteristic curve, thereby improving the reliability of the MRAM.

At least one of the above and other features and advantages of the present invention may be realized by providing a magnetic random access memory (MRAM) including a switching device and a magnetic tunneling junction (MTJ) cell connected to the switching device, wherein the MTJ cell includes a pinned film having a metal film and a magnetic film, the magnetic film enclosing the metal film.

The metal film may be ruthenium (Ru) or another metal and the magnetic film may be a cobalt iron (CoFe) film.

The magnetic film may include a first magnetic film and a second magnetic film, wherein an outer portion of the first magnetic film contacts an outer portion of the second magnetic film. The first magnetic film and the second magnetic film may be formed of the same magnetic material. A thickness of a first portion of the magnetic film, which is disposed on the metal film, may be different from a thickness of a second portion of the magnetic film, which is disposed under the metal film.

At least one of the above and other features and advantages of the present invention may be realized by providing a method of manufacturing a magnetic random access memory (MRAM) including forming a switching device in a substrate, forming an interlayer dielectric on the substrate to cover the switching device, forming a stack structure on a predetermined region of the interlayer dielectric, the stack structure including a lower electrode, a buffering film, a pinning film, a first magnetic film, a metal film, a second magnetic film, a tunneling film, a free magnetic film, and a capping film, and the stack structure being connected to the switching device, and contacting the first magnetic film to the second magnetic film in the stack structure.

Forming the stack structure may include sequentially stacking the lower electrode, the buffering film, the pinning film, the first magnetic film, the metal film, the second magnetic film, the tunneling film, the free magnetic film, and the capping film. In this case, forming the stack structure may further include forming a contact hole in the interlayer dielectric to expose the switching device, filling the contact hole with a conductive plug, sequentially forming the lower electrode to cover the conductive plug, the buffering film, the pinning film, the first magnetic film, the metal film, the second magnetic film, the tunneling film, the free magnetic film, and the capping film on the interlayer dielectric, forming a photoresist pattern on the capping film to define the predetermined region of the interlayer dielectric, etching the films stacked on the interlayer dielectric using the photoresist pattern as an etch mask, and removing the photoresist pattern. In this method, contacting the first magnetic film to the second magnetic film may be performed before stacking the tunneling film, the free magnetic film, and the capping film.

Contacting the first magnetic film to the second magnetic film may include removing an outer portion of the metal film. The first magnetic film and the second magnetic film may be formed to different thicknesses. Removing the outer portion of the metal film may include etching using an etchant having a high etch selectivity with respect to the metal film.

Alternatively, forming the stack structure may include sequentially stacking the lower electrode, the buffering film, the free magnetic film, the tunneling film, the first magnetic film, the metal film, the second magnetic film, the pinning film, and the capping film. Forming the stack structure may further include forming a contact hole in the interlayer dielectric to expose the switching device, filling the contact hole with a conductive plug, sequentially forming the lower electrode to cover the conductive plug, the buffering film, the free magnetic film, the tunneling film, the first magnetic film, the metal film, the second magnetic film, the pinning film, and the capping film on the interlayer dielectric, forming a photoresist pattern on the capping film to define the predetermined region of the interlayer dielectric, etching the films stacked on the interlayer dielectric using the photoresist pattern as an etch mask, and removing the photoresist pattern. In this method, contacting the first magnetic film to the second magnetic film may be performed before stacking the pinning film and the capping film.

The buffering film may be an amorphous film. The pinning film may be a semi-ferromagnetic film. Each of the first and second magnetic films may be a semi-ferromagnetic film. Each of the first and second magnetic films may be a cobalt iron (CoFe) film. The metal film is ruthenium (Ru) or another metal.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
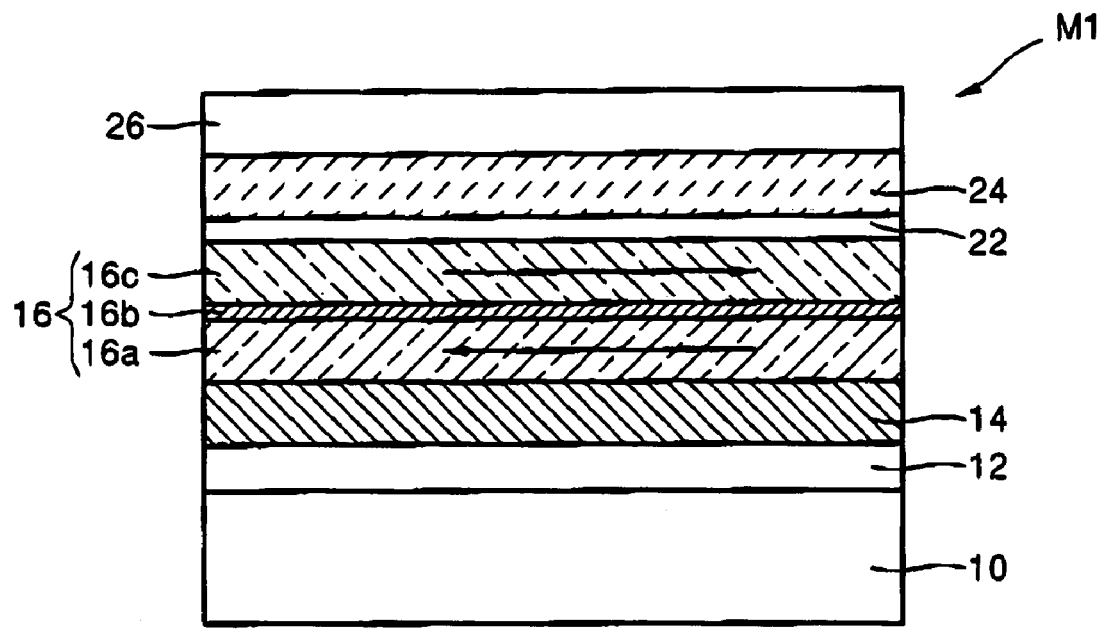
FIG. 1 illustrates a cross-sectional view of a conventional MTJ cell included in a conventional MRAM.
Figure 2:
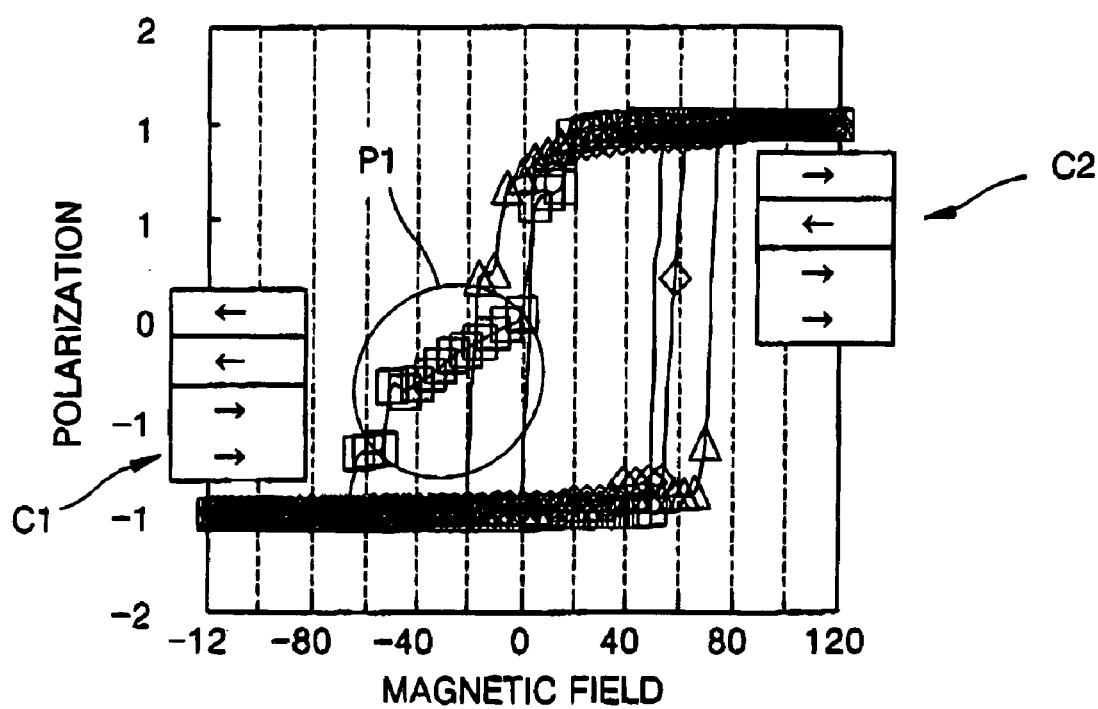
FIGS. 2 through 5 are graphs each showing a switching characteristic of a free magnetic film depending on thicknesses of an SAF film in the conventional MTJ cell shown in FIG. 1.
Figure 3:
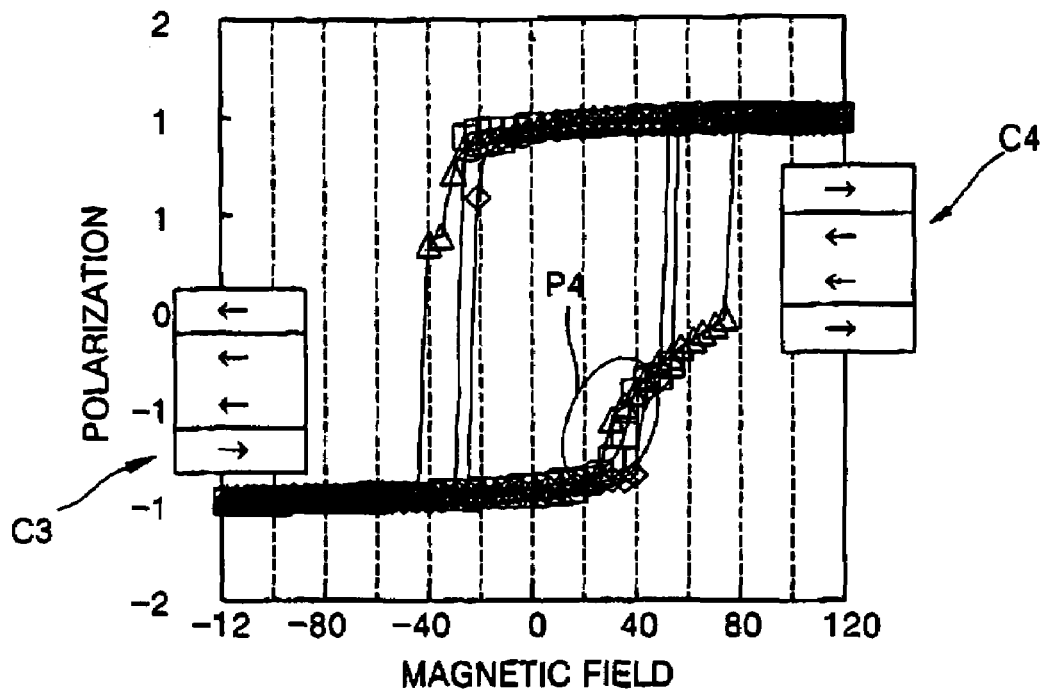
Figure 4:
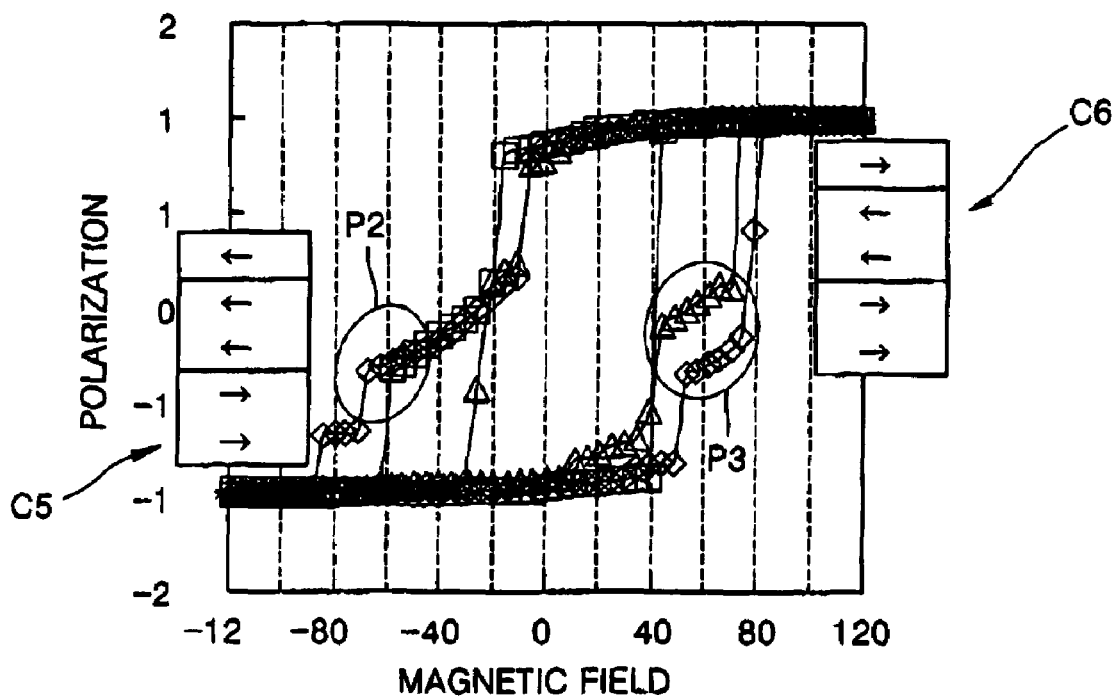
Figure 5:
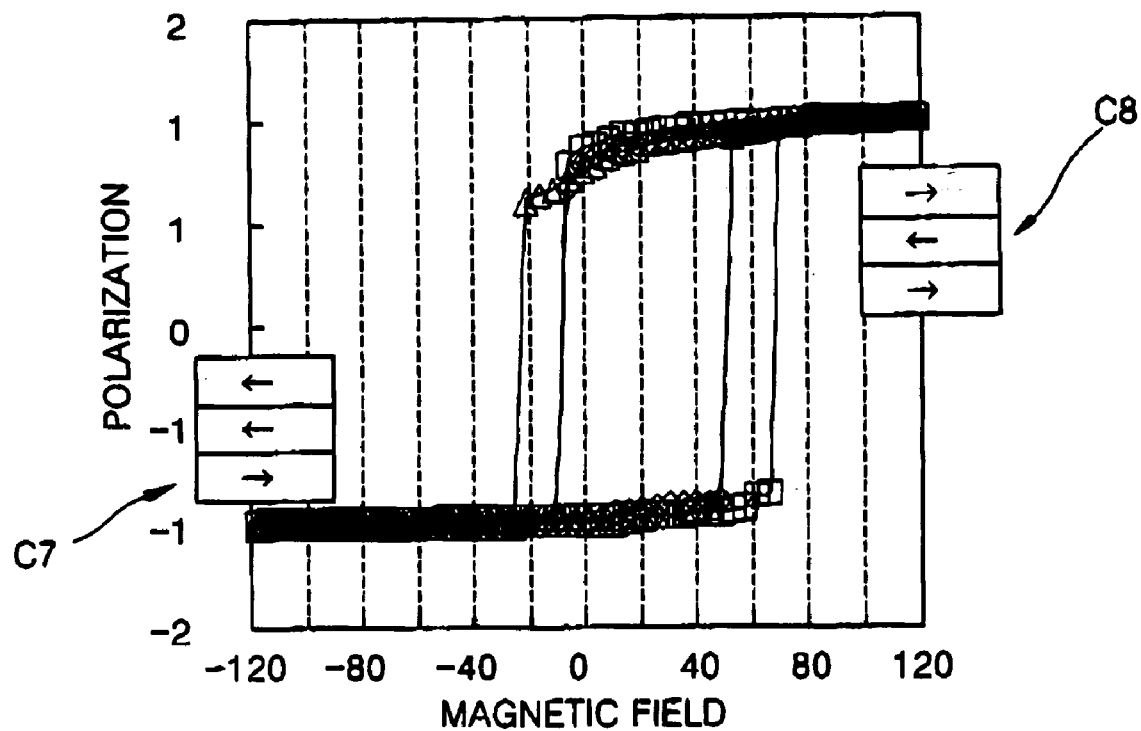

Korean Patent Application No. 2003-74663, filed on Oct. 24, 2003, in the Korean Intellectual Property Office, and entitled: "Magnetic Random Access Memory and Method of Manufacturing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The structure of an MTJ cell of an MRAM according to embodiments of the present invention will now be described.

FIRST EMBODIMENT

Figure 6:
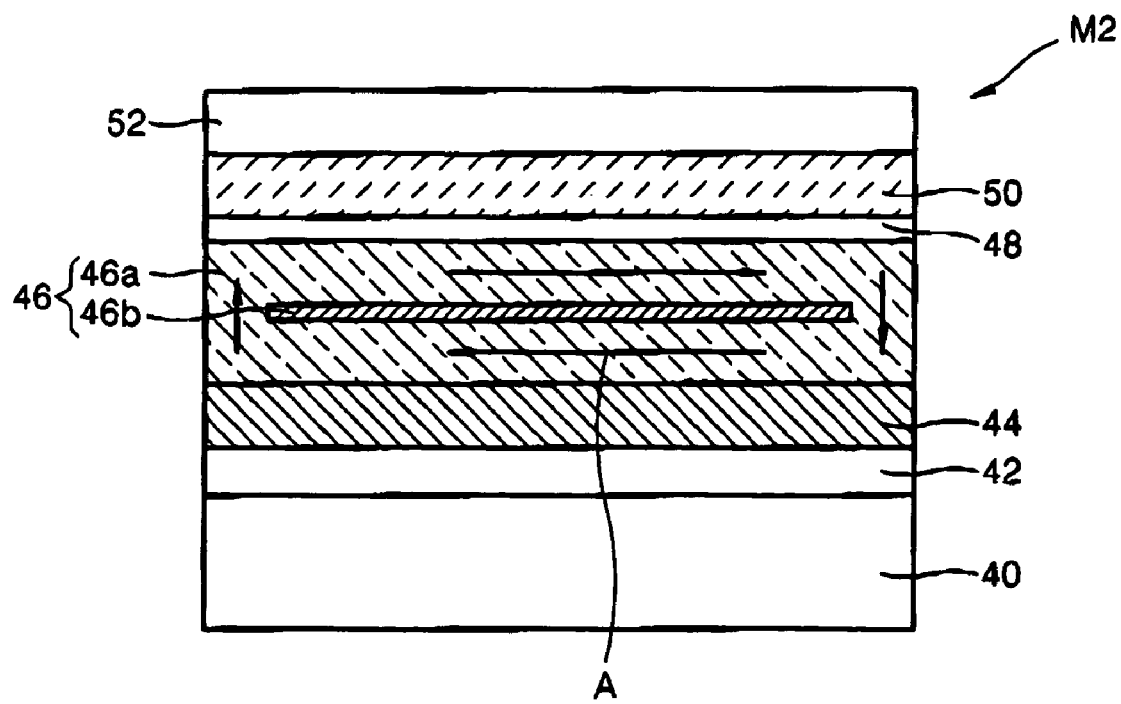
FIG. 6 illustrates a cross-sectional view of an MTJ cell included in an MRAM according to a first embodiment of the present invention.

FIG. 6 illustrates an MTJ cell included in an MRAM according to a first embodiment of the present invention. In FIG. 6, an MTJ cell M2 includes a buffering film 42 and a pinning film 44, which are sequentially formed on a lower electrode 40. The buffering film 42 may be an amorphous film, and the pinning film 44 may be a semi-ferromagnetic film. A pinned film 46 is disposed on the pinning film 44. The pinned film 46 includes first and second material films 46a and 46b. The first material film 46a is a semi-ferromagnetic film, for example, a cobalt iron (CoFe) film, with a predetermined thickness. The second material film 46b of the pinned film 46 is disposed within the first material film 46a and extends near an outer portion of the first material film 46a. The second material film 46b is enclosed by the first material film 46a. A portion of the first material film 46a disposed on the second material film 46b (hereinafter, an upper portion of the first material film 46a) may preferably be as thick as a portion of the first material film 46b disposed under the second material film 46b (hereinafter, a lower portion of the first material film 46b). However, such a configuration is not necessary, i.e., the upper and lower portions of the first material film 46b may have different thicknesses. The second material film 46b may be formed of ruthenium (Ru) or another metal.

Since the first material film 46a encloses the second material film 46b in the pinned film 46, a magnetic field generated in the first material film 46a forms a closed loop that surrounds the second material film 46b as illustrated by arrows A in FIG. 6. Thus, since a stray magnetic field generated in the pinned film 46 is minimized, the influence of the stray magnetic field to the outside is negligible. A tunneling film 48, which may be thin, is formed on the pinned film 46. A free magnetic film 50 and a capping film 52 are then sequentially stacked on the tunneling film 48. The magnetization direction of the free magnetic film 50 varies according to the direction of an external magnetic field, and the capping film 52 protects the free magnetic film 50.

The above-described structure of the pinned film 46 eliminates or minimizes an intensity of a stray magnetic field. Thus, when the free magnetic film 50 is switched, an influence of the stray magnetic field on the free magnetic film 50 is negligible.

In the MTJ cell M2 according to the first embodiment of the present invention, the influence of an external magnetic field, in particular, a magnetic field generated in the pinned film 46, on the free magnetic field 50 can be eliminated so that a shifting of the switching field or a kink can be prevented while the free magnetic film 50 is being switched.

Figure 7:
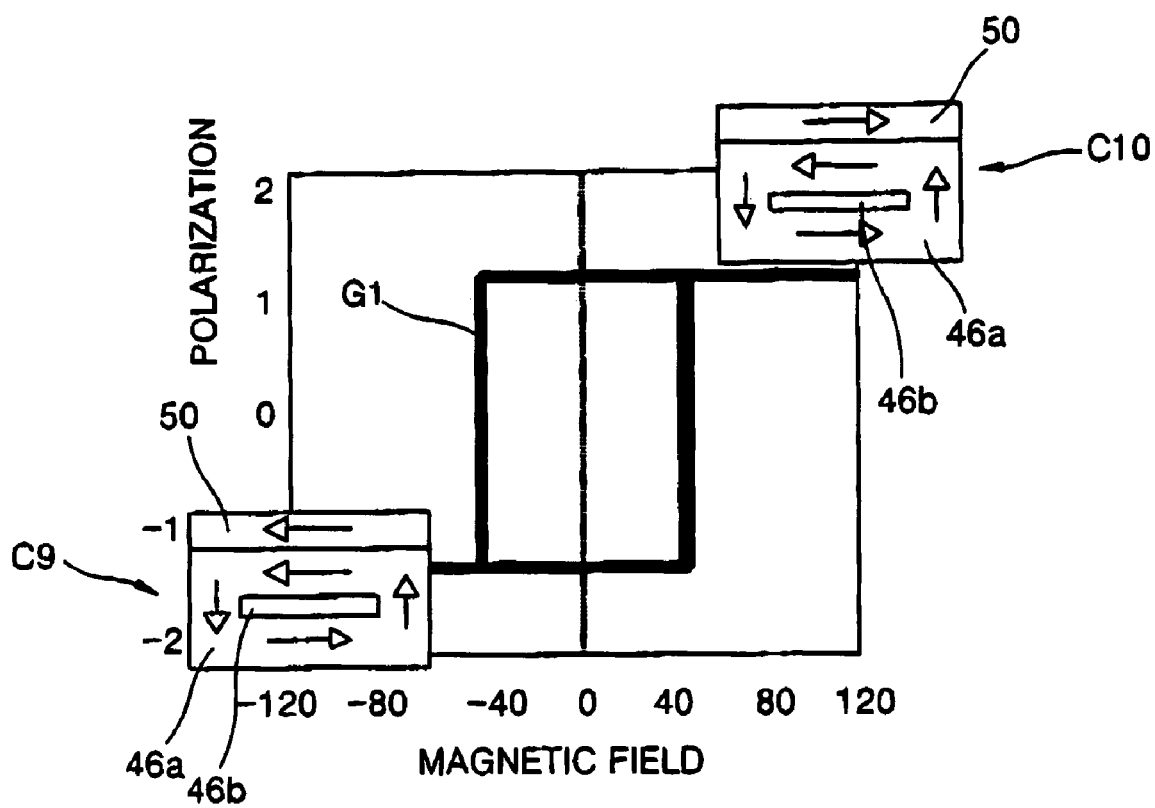
FIG. 7 is a graph showing a switching characteristic of a free magnetic film of the MTJ cell shown in FIG. 6.

FIG. 7 is a graph showing a switching characteristic of a free magnetic film of the MTJ cell shown in FIG. 6.

In FIG. 7, reference characters C9 and C10 denote a ninth magnetization state indicating unit and a tenth magnetization state indicating unit (hereinafter, ninth and tenth indicating units), which show the magnetic fields of the free magnetic film 50 and the pinned film 46 of the MTJ cell M2 shown in FIG. 6.

In the ninth and tenth indicating units C9 and C10, although the upper portion of the first material film 46a is illustrated as being as thick as the lower portion thereof in FIG. 6, as noted above, it is possible to form the upper and lower portions of the first material film 46a to different thicknesses. Further, the result shown in FIG. 7 can be applied irrespective of the thicknesses of the upper and lower portions of the first material film 46a.

In FIG. 7, reference character G1 indicates a switching characteristic curve of the free magnetic film 50. Referring to FIG. 7, the switching characteristic curve G1 is symmetrical except in saturation regions of a magnetic polarization. The result shown in FIG. 7 indicates that a switching field is not shifted during the switching of the free magnetic field 50.

As compared with the conventional switching characteristic curves, as shown in FIGS. 2 through 5, the switching characteristic curve G1 is substantially closer to an ideal form. That is, no magnetic field other than a switching magnetic field, e.g., a stray magnetic field, affects the switching of the free magnetic field 50.

SECOND EMBODIMENT

Figure 8:
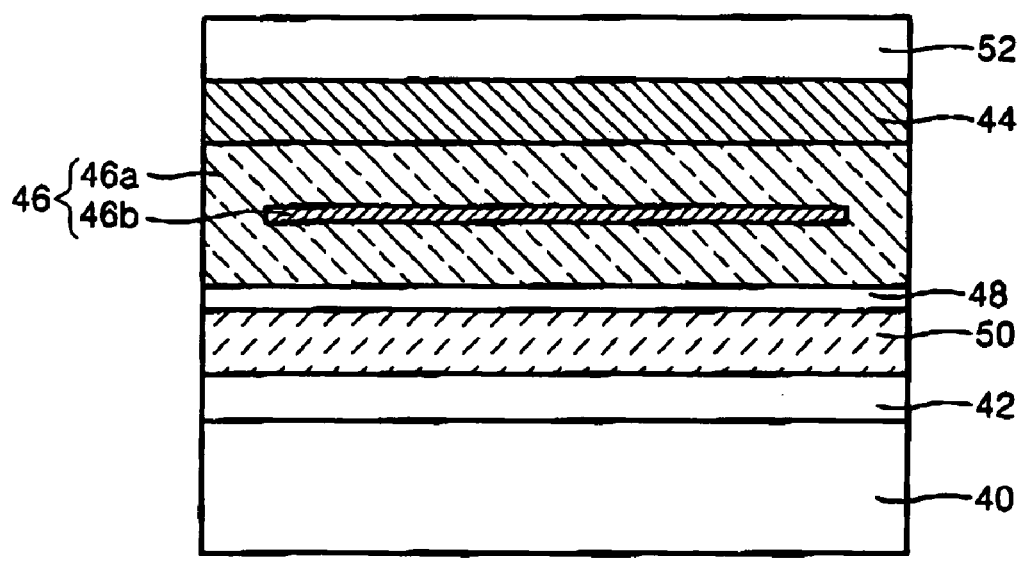
FIG. 8 illustrates a cross-sectional view of an MTJ cell included in an MRAM according to a second embodiment of the present invention.

FIG. 8 illustrates a cross-sectional view of an MTJ cell included in an MRAM according to a second embodiment of the present invention.

The MTJ cell of the second embodiment is similar to the MTJ cell of the first embodiment except in that the magnetic film including the pinned film and the pinning film are disposed on the tunneling film, and the free magnetic film is disposed under the tunneling film.

Referring to FIG. 8, the buffering film 42 is disposed on the lower electrode 40, and the free magnetic film 50 and the tunneling film 48 are sequentially stacked on the buffering film 42. The pinned film 46, the pinning film 44, and the capping film 52 are sequentially stacked on the tunneling film 48. The pinned film 46 includes the first material film 46a and the second material film 46b included within, i.e., is enclosed by, the first material film 46a. In addition, an upper electrode (not shown) is disposed on the capping film 52.

A method of manufacturing the MRAM including the MTJ cell M2 shown in FIG. 6 will now be described. Since all other processes in the formation of the MRAM, except for a process of forming the MTJ cell M2, can be performed by an ordinary method, descriptions thereof will be omitted.

Figure 9:
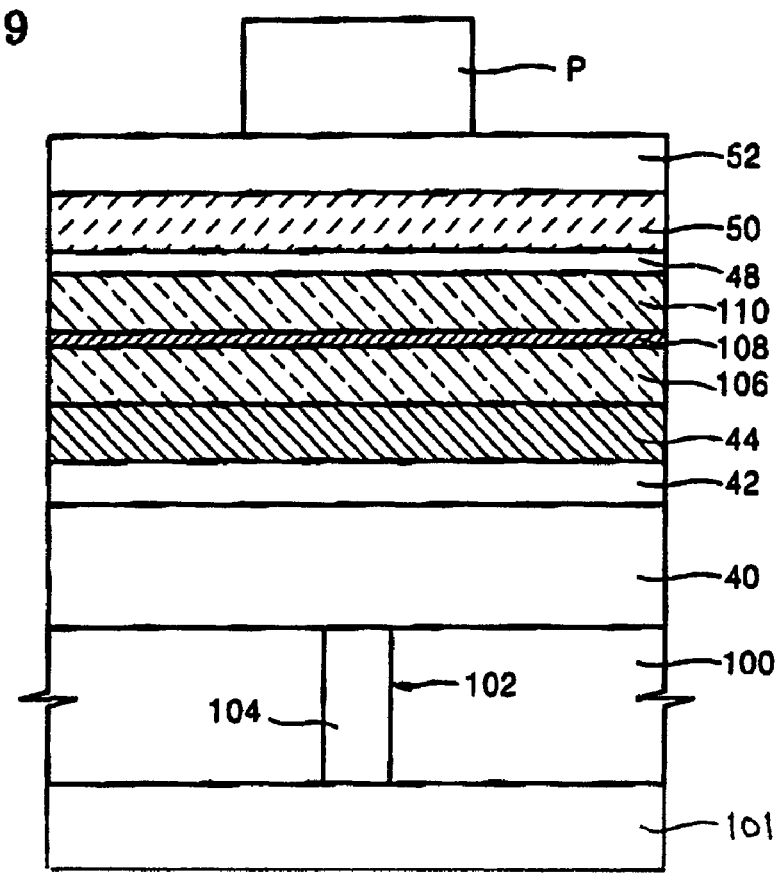
FIGS. 9 through 11 illustrate cross-sectional views of stages in a method of manufacturing the MTJ cell shown in FIG. 6.

Referring to FIG. 9, an interlayer dielectric (ILD) 100 is formed on a substrate (not shown) to cover a transistor, and a contact hole 102 is formed in the ILD 100 to expose a portion of the transistor. The contact hole 102 is then filled with a conductive plug 104, and the lower electrode 40 is formed on the ILD 100 to cover the entire surface of the conductive plug 104.

Although not shown in the drawings, a pad conductive film may be further formed between the conductive plug 104 and the lower electrode 40 to connect them. The buffering film 42 and the pinning film 44 are sequentially formed on the lower electrode 40. The buffering film 42 is formed of an amorphous material, and the pinning film 44 is formed of a semi-ferromagnetic material.

A first magnetic film 106, a metal film 108, and a second magnetic film 110 are sequentially stacked on the pinning film 44. The first and second magnetic films 106 and 110 may be formed of the same magnetic material, i.e., the same ferromagnetic film. For example, the first and second magnetic films 106 and 110 may be formed of cobalt iron (CoFe). The metal film 108 may be formed of ruthenium (Ru). The first and second magnetic film 106 and 110 and the metal film 108 constitute the pinned film 46 as shown in FIG. 6. After the second magnetic film 110 is formed, the tunneling film 48, the free magnetic film 50, and the capping film 52 are sequentially formed on the second magnetic film 110.

A photoresist pattern P is then formed on the capping film 52 to define a predetermined region, i.e., the MTJ cell. The material films 40, 42, 44, 106, 108, 110, 48, 50, and 52 stacked on the ILD 100 are etched using the photoresist pattern P as an etch mask until the ILD 100 is exposed.

Thereafter, the photoresist pattern P is removed, and appropriate cleaning and drying processes are performed.

Figure 10:
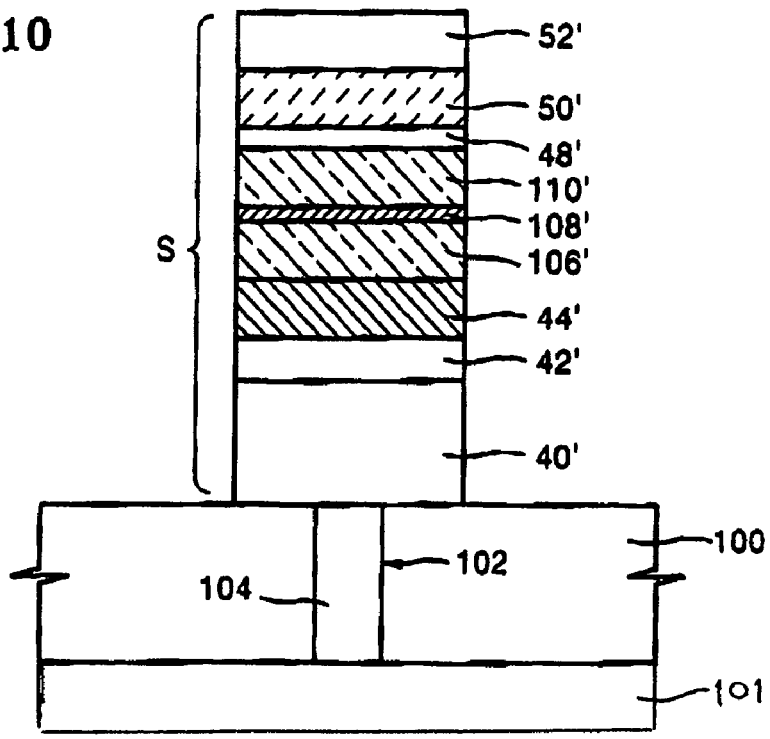

Thus, as shown in FIG. 10, a stack structure S, which is connected to the transistor via the conductive plug 104 and includes the now etched films 40', 42', 44', 106', 108', 110', 48', 50', and 52', is formed on the ILD 100.

After forming the stack structure S, the stack structure S is wet etched using an etchant having a high etch selectivity with respect to the metal film 108 for a predetermined time. The wet etching is performed to remove an outer portion of the metal film 108' and is continued until the outer portion of the metal film 108 is removed and an outer portion of the first magnetic film 106 contacts an outer portion of the second magnetic film 110.

Figure 11:
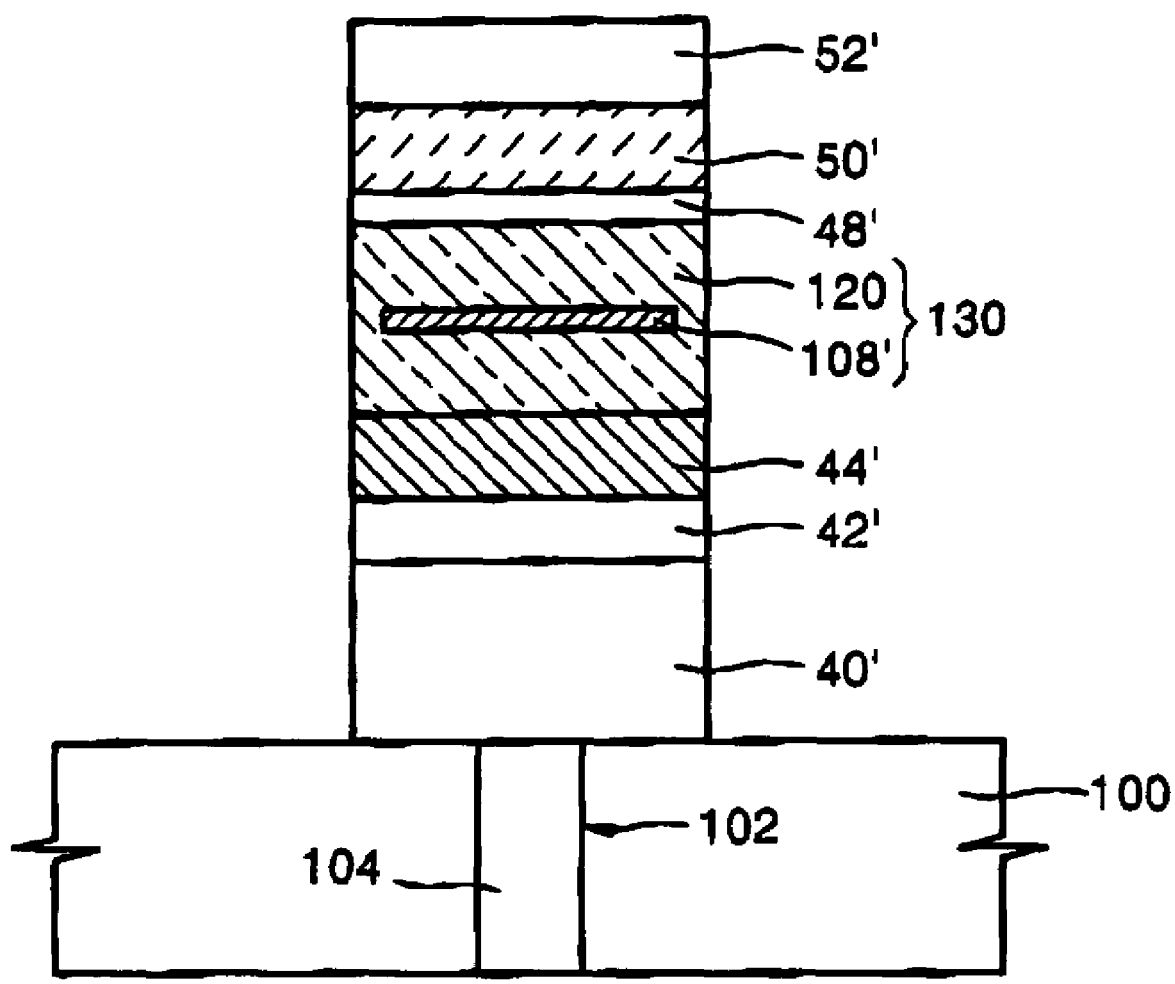

As a result, as shown in FIG. 11, the first and second magnetic films 106' and 110' become a single magnetic film 120 enclosing the metal film 108'. Thus, the MTJ cell including a pinned film 130, which is comprised of the magnetic film 120 and the metal film 108', is completed on the ILD 100.

Alternatively, in the foregoing method of manufacturing an MRAM as described with reference to FIG. 11, the free magnetic film 50 may be stacked before the magnetic film including the pinning film 44 and the pinned film 130.

For example, the buffering film 42, the free magnetic film 50, and the tunneling film 48 may be sequentially stacked on the lower electrode 40.

Then, the pinned film 130, the pinning film 44, and the capping film 52 may be sequentially stacked on the tunneling film 48. Detailed descriptions of a stacking process of each material film are the same as in the above descriptions and will not be repeated.

As described above, in the MRAM according to the present invention, the SAF film, which is used as the pinned film of the MTJ cell, includes the metal film and the magnetic film enclosing the metal film, so that the magnetic film forms a closed loop around the metal film. Thus, since a magnetic field generated in the magnetic film also forms a closed loop, a stray magnetic film caused by the pinned film is minimized to avoid adversely affecting the function of the free magnetic film. Therefore, the MRAM according to the present invention can prevent shifting of a switching field or a kink caused by the stray field, thereby improving the reliability of the MRAM.

Exemplary embodiments of the present invention have been disclosed herein and, although specific terms are employed, they are used and are to be interpreted in a generic and descriptive sense only and not for purpose of limitation. For example, those of ordinary skill in the art can form the foregoing MTJ cell using an etching process other than the exemplary wet etching and pattern the metal film 108 so that the metal film 108 is surrounded by the first and second magnetic films 106 and 110 when the first magnetic film 106, the metal film 108, and the second magnetic film 110 are stacked. Accordingly, it will be understood by those of ordinary skill in the art that various changes in form and details may be made without departing from the spirit and scope of the present invention as set forth in the following claims.

What is claimed is:

1. A magnetic random access memory (MRAM) comprising a switching device and a magnetic tunneling junction (MTJ) cell connected to the switching device, wherein the MTJ cell includes:
   a pinned film having a single metal film and a magnetic film, the magnetic film enclosing the metal film;
   a tunneling film; and
   a free magnetic film, wherein:
   the tunneling film is disposed between the free magnetic film and the pinned film, and
   the metal film extends laterally within the magnetic film and has a width that is less than that of the magnetic film.

2. The MRAM as claimed in claim 1, wherein the metal film is ruthenium (Ru) or another metal and the magnetic film is a cobalt iron (CoFe) film.

3. The MRAM as claimed in claim 1, wherein the magnetic film comprises:
- a first magnetic film; and
- a second magnetic film,
  wherein an outer portion of the first magnetic film contacts an outer portion of the second magnetic film.

4. The MRAM as claimed in claim 3, wherein the first magnetic film and the second magnetic film are formed of the same magnetic material.

5. The MRAM as claimed in claim 1, wherein a thickness of a first portion of the magnetic film, which is disposed on the metal film, is different from a thickness of a second portion of the magnetic film, which is disposed under the metal film.

6. The MRAM as claimed in claim 1, further comprising a lower electrode, a buffering film, a pinning film, a tunneling film, a free magnetic film, and a capping film disposed in a stack with the pinned film.

7. The MRAM as claimed in claim 6, wherein the pinning film is formed between the lower electrode and the pinned film.

8. The MRAM as claimed in claim 6, wherein the pinned film is formed between the tunneling film and the pinning film.

9. The MRAM as claimed in claim 6, wherein the tunneling film is formed between the free magnetic film and the pinned film.

10. The MRAM as claimed in claim 1, further comprising an interlayer dielectric covering the switching device, wherein the switching device is connected to the MTJ cell by a conductive plug that passes through the interlayer dielectric.

11. The MRAM as claimed in claim 1, wherein the first and second magnetic films contact each other only at sides of the pinned film.

12. The MRAM as claimed in claim 1, wherein the free magnetic film is a single material.

13. A magnetic random access memory (MRAM) comprising a switching device and a magnetic tunneling junction (MTJ) cell connected to the switching device, wherein the MTJ cell includes:
- a pinned film having a single metal film and a magnetic film, the magnetic film enclosing the metal film such that exactly one closed loop surrounding the metal film can be formed in the magnetic film by a magnetic field generated in the magnetic film;
- a tunneling film; and
- a free magnetic film, wherein the tunneling film is disposed between the free magnetic film and the pinned film.

14. The MRAM as claimed in claim 13, wherein the magnetic film comprises:
- a first magnetic film; and
- a second magnetic film, wherein:
- an outer portion of the first magnetic film contacts an outer portion of the second magnetic film, and
- the closed loop surrounding the metal film extends between the tunneling film and the metal film, within the first magnetic film.

15. The MRAM as claimed in claim 13, wherein the free magnetic film is a single material.

* * * * *